(12) United States Patent
Fan

(10) Patent No.: US 6,791,747 B2
(45) Date of Patent: Sep. 14, 2004

(54) MULTICHANNEL LASER TRANSMITTER SUITABLE FOR WAVELENGTH-DIVISION MULTIPLEXING APPLICATIONS

(75) Inventor: Tso Yee Fan, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/904,223

(22) Filed: Jul. 12, 2001

(65) Prior Publication Data

US 2002/0159140 A1 Oct. 31, 2002

Related U.S. Application Data

(60) Provisional application No. 60/286,474, filed on Apr. 25, 2001.

(51) Int. Cl.[7] ................................................. H01S 3/00
(52) U.S. Cl. ................... 359/349; 372/29.011; 372/32; 372/92; 372/98
(58) Field of Search .................. 372/92, 28, 29.011, 372/32, 98; 359/349

(56) References Cited

U.S. PATENT DOCUMENTS

| | | | |
|---|---|---|---|
| 4,264,869 A | 4/1981 | Hunter | 330/4.3 |
| 4,757,268 A | 7/1988 | Abrams et al. | 330/4.3 |
| 4,794,345 A | 12/1988 | Linford et al. | 330/4.3 |
| 4,856,010 A * | 8/1989 | Wissman et al. | 372/28 |
| 5,081,637 A | 1/1992 | Fan et al. | 372/72 |
| 5,095,487 A | 3/1992 | Meyerhofer et al. | 372/23 |
| 5,115,444 A * | 5/1992 | Kirkby et al. | 372/102 |
| 5,163,058 A | 11/1992 | Farries et al. | 372/6 |
| 5,185,758 A | 2/1993 | Fan et al. | 372/72 |
| 5,189,676 A | 2/1993 | Wysocki et al. | 372/6 |
| 5,274,657 A | 12/1993 | Hori et al. | 372/50 |
| 5,289,485 A * | 2/1994 | Mooradian | 372/45 |
| 5,373,526 A | 12/1994 | Lam et al. | 372/69 |
| 5,379,310 A * | 1/1995 | Papen et al. | 372/102 |
| 5,386,431 A | 1/1995 | Tulip | 372/68 |
| 5,392,154 A | 2/1995 | Chang et al. | 359/341 |
| 5,440,576 A | 8/1995 | Welch et al. | 372/50 |
| 5,524,012 A * | 6/1996 | Wang et al. | 372/23 |
| 5,594,744 A * | 1/1997 | Lefevre et al. | 372/102 |
| 5,613,058 A * | 3/1997 | Koppolu et al. | 345/744 |
| 5,773,345 A | 6/1998 | Ota | 438/286 |
| 5,784,188 A * | 7/1998 | Nakamura et al. | 359/245 |
| 5,802,084 A | 9/1998 | Bowers et al. | 372/18 |
| 5,832,006 A | 11/1998 | Rice et al. | 372/3 |
| 5,832,020 A | 11/1998 | Kong | 372/72 |
| 5,859,945 A | 1/1999 | Kato et al. | 385/89 |
| 5,930,030 A | 7/1999 | Scifres | 359/341 |
| 5,936,763 A | 8/1999 | Mitsuda et al. | 359/341 |
| 5,946,130 A | 8/1999 | Rice | 359/349 |

(List continued on next page.)

FOREIGN PATENT DOCUMENTS

FR 2 630 268 A1 * 4/1988
WO WO 94/15386 * 7/1994

OTHER PUBLICATIONS

Zirngibl et al. "An 18–Channel Multifrequency Laser." Photonics Tech. Lett. 8:7, Jul. 1996, pp. 870–872.*

(List continued on next page.)

Primary Examiner—Thomas G. Black
Assistant Examiner—Stephen Cunningham
(74) Attorney, Agent, or Firm—Testa, Hurwitz & Thibeault LLP

(57) ABSTRACT

A laser transmitter capable of transmitting large numbers of WDM channels but requiring locking of only a single channel. Each of the channels can be individually modulated using an external modulator.

17 Claims, 2 Drawing Sheets

U.S. PATENT DOCUMENTS

| | | | | |
|---|---|---|---|---|
| 6,014,237 A | * | 1/2000 | Abeles et al. | 359/123 |
| 6,018,535 A | * | 1/2000 | Maeda | 372/102 |
| 6,049,554 A | * | 4/2000 | Lang et al. | 372/102 |
| 6,061,170 A | | 5/2000 | Rice et al. | 359/341 |
| 6,081,369 A | | 6/2000 | Waarts et al. | 359/341 |
| 6,118,802 A | * | 9/2000 | Sanders et al. | 372/45 |
| 6,167,075 A | | 12/2000 | Craig et al. | 372/75 |
| 6,175,579 B1 | * | 1/2001 | Sandford et al. | 372/32 |
| 6,192,062 B1 | | 2/2001 | Sanchez-Rubio et al. | 372/92 |
| 6,208,679 B1 | | 3/2001 | Sanchez-Rubio et al. | 372/92 |
| 6,236,666 B1 | * | 5/2001 | Mirov et al. | 372/101 |
| 6,256,328 B1 | * | 7/2001 | Delfyett et al. | 372/18 |
| 6,327,292 B1 | | 12/2001 | Sanchez-Rubio et al. | 372/92 |
| 6,339,609 B2 | * | 1/2002 | Lefevre | 372/102 |
| 6,370,170 B1 | * | 4/2002 | Glance | 372/28 |
| 6,370,290 B1 | * | 4/2002 | Ball et al. | 385/14 |
| 6,418,152 B1 | * | 7/2002 | Davis | 372/101 |
| 2001/0036209 A1 | * | 11/2001 | Delfyett et al. | 372/23 |
| 2002/0131164 A1 | * | 9/2002 | Palese | 359/349 |

OTHER PUBLICATIONS

Zhu et al. "Multiwavelength Picosecond Optical Pulse Generation Using an Actively Mode–Locked Multichannel Grafting Cavity Laser." J. Lightwave Tech. 13:12, Dec. 1995, pp. 2327–2335.*

White, I.H. "A Multichannel Grating Cavity Laser for Wavelength Division Multiplexing Applications." J. Lightwave Tech. 9:7, Ju 1991, pp. 893–899.*

Glas, P. et al. "Dynamic Characteristics of a Transient Phase–Coupled and Mode–Locked Fiber–Array Laser," IEEE J. Quantum Elect. 31:9, Sep. 1995, pp. 1619–1625.

Sumida, D. et al. "An 8.2 J Phase–conjugate Solid–State Laser Coherently Combining Eight Parallel Amplifiers," IEEE J. Quantum Elec. vol. 30, No. 111, Nov. 1994, pp. 2617–2627.

No. K.H. et al. "One Dimensional Scaling of 100 Ridge Waveguide Amplifiers," IEEE Photonics Tech. Lett. vol. 6, No. 9, pp. 1062–1066.

* cited by examiner

MULTICHANNEL LASER TRANSMITTER SUITABLE FOR WAVELENGTH-DIVISION MULTIPLEXING APPLICATIONS

CROSS-REFERENCE TO RELATED APPLICATION

This application claims the benefits of U.S. Provisional Application Serial No. 60/286,474, filed on Apr. 25, 2001.

GOVERNMENT FUNDING

This invention was made with government support under Contract No. F1962895-C-0002 awarded by the United States Air Force. The government has certain rights in the invention.

FIELD OF THE INVENTION

The present invention relates generally to laser communication systems, and in particular to systems involving wavelength-division multiplexing.

BACKGROUND OF THE INVENTION

In communication systems utilizing wavelength-division multiplexing (WDM), light of multiple wavelengths (actually narrow wavelength bands) propagates through a transmission medium, typically an optical fiber. Because the wavelengths are spaced apart spectrally and do not interfere with each other, they represent separate communication channels that can be independently modulated to carry information. To select a particular channel, its wavelength is extracted—i.e., demultiplexed—from the multiple-wavelength signal.

The combined WDM optical signals can be amplified as a group and transported over a single fiber to increase capacity. Each carried signal can be modulated at a different rate and in a different format (SONET, ATM, data, etc.)

Naturally, each transmitting laser in a WDM system must be configured to operate at the wavelength corresponding to its assigned channel. Ordinarily it is necessary to exert absolute frequency control over the laser sources, particularly in the case of semiconductor lasers, which possess a nominal operating frequency that is difficult to control precisely upon fabrication and which fluctuates with injection current, junction temperature and aging. Thus, an individual frequency-locked transmitter is typically used for each channel, and consequently, as the number of WDM channels increases, the transmitter farms needed to provide them become significantly more complex.

BRIEF SUMMARY OF THE INVENTION

The present invention provides a transmitter capable of transmitting large numbers of WDM channels but requiring locking of only a single channel. Each of the channels can be individually modulated using an external modulator.

The transmitter is preferably a multichannel external cavity laser similar in certain respects to those described in U.S. Pat. Nos. 6,192,062 and 6,208,679, and U.S. Ser. No. 09/708,697 now U.S. Pat. No. 6,697,192 (filed on Nov. 8, 2000), the entire disclosures of which are hereby incorporated by reference. The '697 application, for example, describes external-cavity laser designs that generate coaxially overlapping outputs at multiple wavelengths. An external laser resonator may be based on a bar of light-emitting semiconductor material whose outputs emerge from a linear sequence of stripes along the length of the bar. These outputs pass through an output-coupling lens and strike a dispersive element, such as a diffraction grating. Light dispersed by the dispersive element is reflected by a mirror back along the optical path, passing through the lens and returning to the semiconductor outputs, the opposite facets of which are partially reflective. The resulting feedback produces laser amplification, and light not reflected by the partial mirror represents discrete, spatially separate outputs.

Thus, the partially reflective semiconductor facets and the mirror together form an ensemble of individual, external-cavity lasers, each with its own optical path. The lens and dispersive element force the individual beams into a coaxial configuration, their paths intercepting at the dispersive element. Moreover, because the beam of each of these lasers strikes the dispersive element at a different angle, each laser has a different optical path and, therefore, resonates at a different wavelength. As a result, the gain elements are forced to produce rear-face outputs at the different resonance wavelengths.

The spatially separated outputs are combined by a similar optical arrangement including a coupling lens and a dispersive element. Once again the lens and dispersive element force the individual beams into a coaxial configuration, causing the different wavelengths to co-propagate. The overall result is a high-power, multi-wavelength beam with high brightness due to the coaxially overlapping component beams, and which may be focused onto the end face of an optical fiber for propagation therethrough.

In accordance with the present invention, the individual, spatially separated outputs are modulated to encode data prior to recombination. A representative laser transmitter includes a linear array of gain elements (e.g., diodes) each having a partial reflecting surface on its outer facet; an optical device (such as a collimating lens and/or a curved mirror); a dispersive element (such as a diffraction grating or prism); and a reflective device (such as a mirror) forming an external cavity. These external-cavity elements are shared by all of the resonators of all of the array elements. The laser resonator for each array element is defined by the optical path between the partial reflector and the mirror.

Fast modulation of each output is facilitated by a modulator array. This design renders the invention well-suited to WDM applications, in which it is ordinarily necessary to modulate each channel independently and desirable to modulate external to the resonator in order to achieve fast modulation rates. Intracavity modulation, which has been previously proposed for these types of sources, limits the modulation bandwidth to approximately the inverse of the cavity ring-down time.

BRIEF DESCRIPTION OF THE DRAWINGS

The foregoing discussion will be understood more readily from the following detailed description of the invention, when taken in conjunction with the accompanying drawings, in which.

DETAILED DESCRIPTION OF THE PREFERRED EMBODIMENTS

Figure 1:
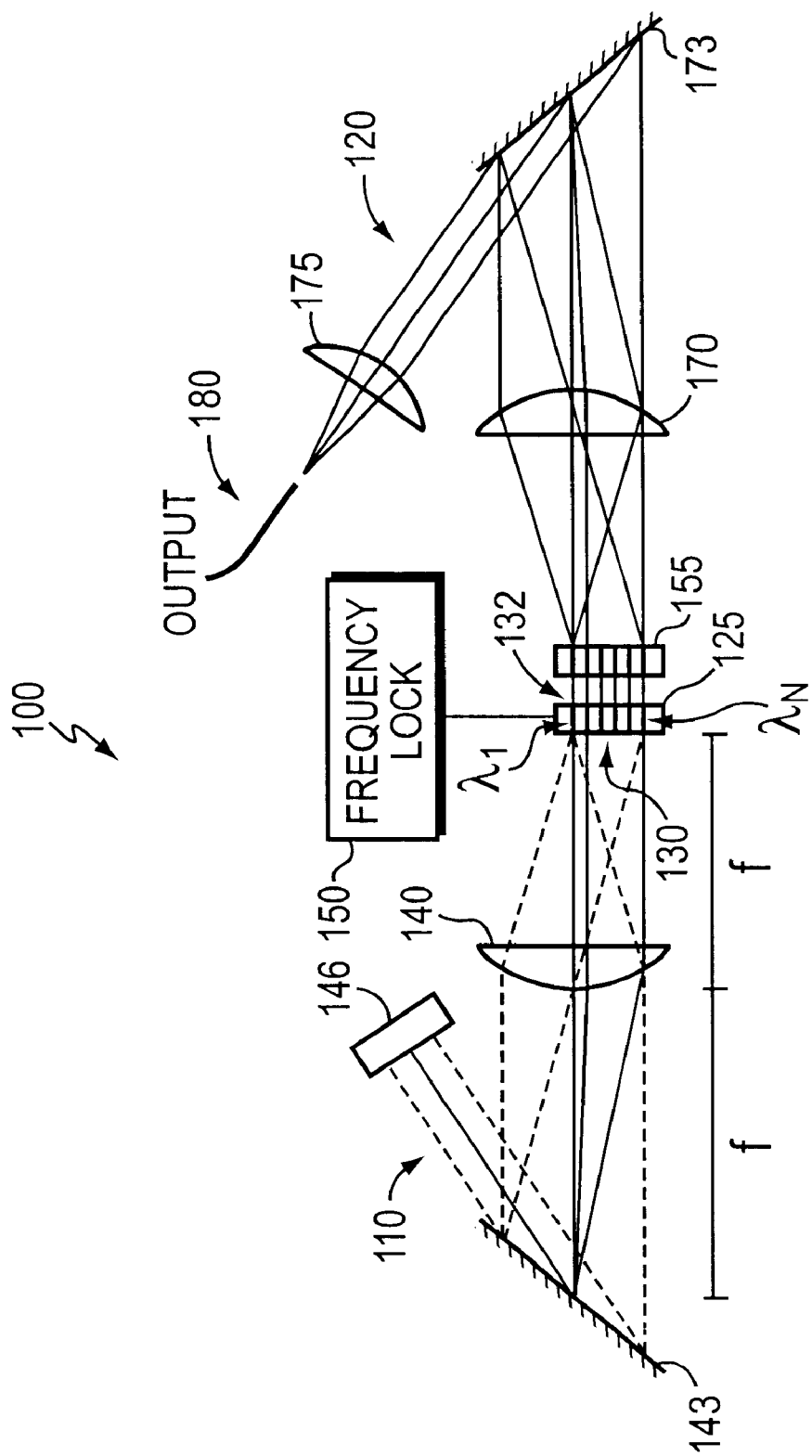
FIG. 1 schematically illustrates a laser transmitter in accordance with the invention.

With reference to FIG. 1, a multichannel laser transmitter 100 includes an external-cavity resonator 110 for generating the component output beams and an output stage 120 by means of which the spectrally distinct outputs are spatially combined.

Resonator 110 includes a set of gain elements 125 which may be implemented as a bar of light-emitting semiconductor material comprising a linear sequence of n emission elements or stripes, indicated at $\lambda_1 \ldots \lambda_n$, where n may range, for example, from two to 100. Alternatively, the emission elements may be discrete multi-mode semiconductor amplifiers, and in still another alternative, the emission elements may be fiber amplifiers.

Bar 125 (or the individual emission elements) has a forward emission face 130, which is generally antireflective, and a partially reflective rear output face 132. That is, output face 132 is provided with a partial-mirror surface. Resonator 110 also includes an optical device (such as a collimating lens and/or a curved mirror) 140; a dispersive element (such as a diffraction grating or prism) 143; and a reflective device (such as a mirror) 146.

In operation, gain-element array 125 is excited (by application of an electric current) such that elements $\lambda_1 \ldots \lambda_n$ emit radiation through face 130. Each of the elements $\lambda_1 \ldots \lambda_n$ emits a beam of radiation having a different free-space optical path. The radiation beams from elements $\lambda_1 \ldots \lambda_n$ all pass through optical device 140 and strike dispersive element 143. Optical device 140 causes the radiation beams to overlap as they reach dispersive element 143. For example, device 140 may be a lens positioned, as indicated in the figure, substantially a focal-length distance away from both emission face 130 and dispersive element 143. The light reflected from dispersive element 143 toward mirror 146 is a composite of the individual beams, which emerge from dispersive element 143 coaxially and normal to mirror 146, which is preferably a high reflector.

This configuration forms a resonator. The optical paths of the beams from emission elements $\lambda_1 \ldots \lambda_n$ all pass through device 140 and are all dispersed by element 143—that is, all beams share device 140 and dispersive element 143—but pass through only one of the emission elements. Light reflected by mirror 146 and received through the emission face 130 is again partially reflected by output face 132, the unreflected portion of each beam representing one of the outputs of resonator 110.

Thus, the gain elements of array 125, in combination with the other optical elements, together form an ensemble of individual external-cavity lasers. Because the beam of each of these lasers is incident on dispersive element 143 at a different angle, each lases at a different wavelength (despite the identical spontaneous emission spectra of the source emission elements). That wavelength, in turn, is determined by the beam's angle of incidence with respect to dispersive element 143 and its angle of diffraction, the optical characteristics of the gain medium, and the grating line spacing of the dispersive element 143. Thus, by varying one or more of these parameters (most simply, the orientation and/or location of dispersive element 143 relative to emission face 130), the wavelengths of the lasers may be tuned. The tuning range depends on the gain bandwidth of the emission elements and the reflectivity of the output face 132. The number of emission elements $\lambda_1 \ldots \lambda_n$ and their locations can be selected so as to generate simultaneously or sequentially any set of wavelengths within the gain width of the gain media.

A frequency-locking circuit 150 is desirably employed to lock the laser emissions to a WDM channel grid (e.g., separated by 50 GHz for dense WDM applications), providing wavelength stability. An important advantage of the present invention is the ability to maintain wavelength stability among all channels by monitoring only a single channel, since the channel separation of emission elements $\lambda_1 \ldots \lambda_n$ occurs by virtue of the physical arrangement of resonator cavity 110. Frequency-locking circuit 150 typically monitors the output frequency of a single channel and generates an error signal representing deviation of the monitored frequency from a standard. In response to the error signal, the frequency of the monitored channel can be adjusted by tilting mirror 146 or grating 143, or alternatively by translating optical device 140 and/or gainelement array 125. Again, since the relative frequencies of all of the channels are controlled by the optical configuration, fixing the frequency of a single channel also fixes the frequency of all of the others.

The outputs of the emission elements through face 132 are directed to output stage 120 through a modulator array 155, which facilitates modulation of each of the output laser beams to encode information. In one embodiment, the array comprises a linear series of electroabsorptive modulators. These are optical devices that act like very fast shutters, blocking the output of an associated emission element or letting it pass. It should be noted that the gain-element array 125 may be combined with an electroabsorptive modulator array on a common silicon platform (that is, monolithically integrated), along with driver and frequency-locking circuitry.

Alternatively, modulator array 155 may be a linear array of Mach-Zehnder interferometers. A Mach-Zehnder interferometer is an optical switch controlled by an external electric field. It utilizes a pair of optical waveguides, each basically a channel of dielectric material surrounded by a substrate material of lower index of refraction n; light is confined within each waveguide and confined therein by total internal reflection (that is, light originating in a material with larger n and incident on a material with lower n will be entirely reflected within the former material at angles of incidence above a critical value). The output from an emission element is split into two components, and these components travel through optical waveguides of equal length before being combined at the output. Normally, both paths have an equal index of refraction, so the beams undergo equal phase shifts as they propagate, and are combined constructively. As a result, the full power of the beam passes through the interferometer. High-voltage electrodes are placed around one of the two paths, however, and the waveguide is electrooptically responsive, so that a strong bias applied across the electrodes causes the index of refraction in that path to be changed; the two beams therefore emerge from the waveguide paths with unequal phases. The bias voltage is precisely what is needed to cause perfect destructive interference, so that no output beam appears.

The outputs from face 132 of gain-element array 125 can be butt-coupled to the modulator array 155 or alternatively re-imaged through the modulator array or coupled to an array of optical fibers, each fiber transmitting an individual output to one of the modulators.

The outputs travel from the modulator array to output stage 120, which comprises a dispersive optical system that combines the spatially separated outputs into a single optical fiber. In the illustrated embodiment, the outputs from modulator array 155 pass through an optical device 170 (e.g., a lens) and strike another dispersive element 173 (e.g., a grating). Optical device 170 causes the beams to overlap as they reach dispersive element 173, and a lens 175 focuses the combined outputs as a single beam onto the end face of an optical fiber 180.

Figure 2:
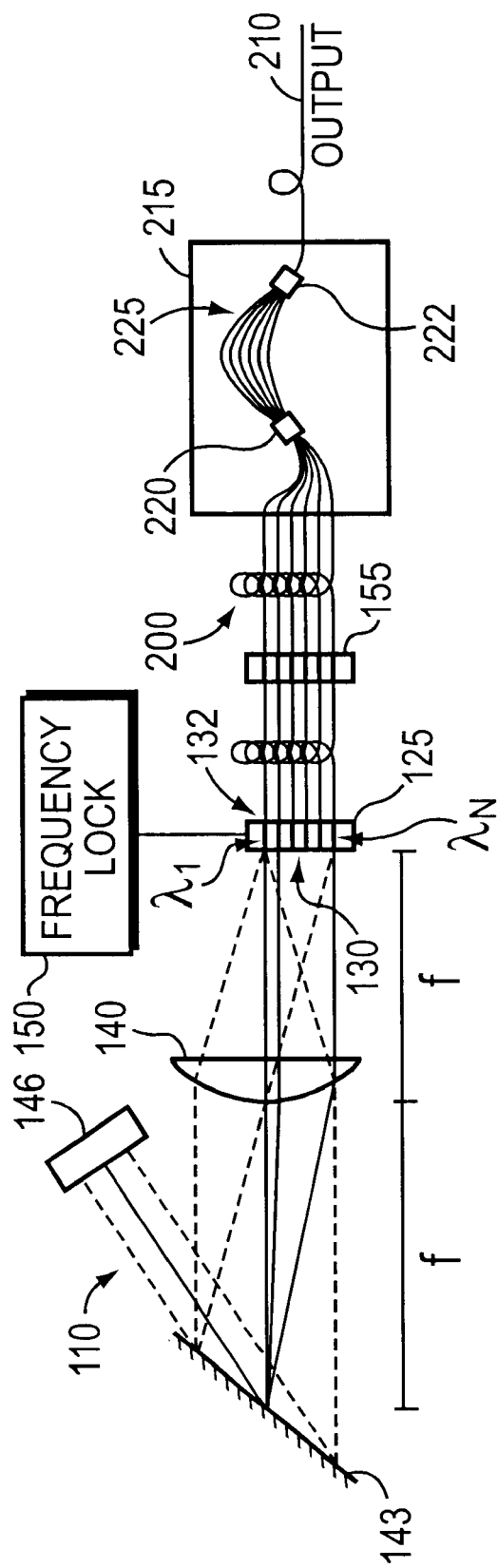
FIG. 2 illustrates an alternative embodiment using an arrayed waveguide grating.

In another alternative, illustrated in FIG. 2, the outputs from the modulator array 155 can be coupled into a series of individual fibers, collectively indicated at 200, and the outputs of fibers 200 then combined into a single fiber 210 using an arrayed waveguide grating (AWG) 215. The AWG 215 essentially functions as a diffraction grating, combining the separately modulated outputs into a single, multichannel optical signal, and includes a pair of couplers 220, 222 and a series of waveguide arms 225 having different path lengths.

Although the present invention has been described with reference to specific details, it is not intended that such details should be regarded as limitations upon the scope of the invention, except as and to the extent that they are included in the accompanying claims.

What is claimed is:

1. A multi-wavelength light-generation system comprising:
   a. an array of optical gain elements producing a plurality of spatially separated optical outputs;
   b. an external cavity optically coupled to the gain elements for controlling the wavelengths of the spatially separated outputs through the respective optical gain elements;
   c. an array of modulators facilitating individual modulation of the spatially separated outputs; and
   d. a spatially dispersive optical system for acting on the modulated system outputs, the optical system combining the outputs such that they are substantially overlapped and co-propagated.

2. The system of claim 1 wherein the modulator array comprises a plurality of electroabsorptive modulators each receiving and modulating one of the spatially separated outputs.

3. The system of claim 1 wherein the modulator array comprises a plurality of Mach-Zehnder interferometers each receiving and modulating one of the spatially separated outputs.

4. The system of claim 1 wherein each of the spatially separated outputs has a different wavelength and is directed to a different modulator.

5. The system of claim 1 wherein each of the spatially separated outputs is directed to a different modulator using an optical fiber.

6. The system of claim 1 wherein the external cavity comprises:
   a. a dispersive element receiving the outputs from the optical gain elements; and
   b. an optical device, the outputs from the optical gain elements being directed by the optical device onto the dispersive element and returned to the optical gain elements so as to force the gain elements to produce the outputs at different resonant wavelengths.

7. The system of claim 6 wherein the external cavity further comprises a reflector for returning light from the dispersive element to the optical gain elements.

8. The system of claim 6 wherein the optical device is a lens or mirror having a focal length, the optical device being disposed between the optical gain elements and the dispersive element, a distance substantially equal to the focal length intervening between the dispersive element and the optical device, and between the optical device and the optical gain elements.

9. The system of claim 1 further comprising a frequency-locking circuit associated with the optical gain elements.

10. The system of claim 9 wherein the optical source comprises a linear series of optical gain elements each emitting at a different frequency, the frequency-locking circuit monitoring an output frequency of a single gain element and generating an error signal indicative thereof.

11. The system of claim 1 wherein the dispersive optical system comprises free-space optical components.

12. The system of claim 1 wherein the dispersive optical system comprises an arrayed waveguide grating.

13. A method of transmitting information by wavelength-division multiplexing, the method comprising the steps of:
   a. producing a plurality of spatially separated optical outputs;
   b. amplifying the outputs in an external cavity configured to control wavelengths associated with the spatially separated outputs;
   c. individually modulating each of the spatially separated outputs to encode information therein; and
   d. causing a spatially dispersive optical system to act upon the modulated outputs in order to combine them such that they are substantially overlapped and co-propagated.

14. The method of claim 13 wherein each of the spatially separated outputs has a different wavelength.

15. The method of claim 13 wherein the spatially separated optical outputs are produced by an optical source comprising a linear series of optical gain elements.

16. The method of claim 17 wherein the external cavity comprises:
   a. a dispersive element receiving the outputs from the optical gain elements; and
   b. an optical device, the outputs from the optical gain elements being directed by the optical device onto the dispersive element and returned to the optical gain elements so as to force the gain elements to produce the outputs at different resonant wavelengths.

17. The method of claim 16 wherein the external cavity comprises:
   a. a dispersive element receiving the outputs from the optical gain elements; and
   b. an optical device, the outputs from the optical gain elements being directed by the optical device onto the dispersive element and returned to the optical gain elements so as to force the gain elements to produce the outputs at different resonant wavelengths.

* * * * *